(12) United States Patent
Mu et al.

(10) Patent No.: US 9,996,458 B1
(45) Date of Patent: Jun. 12, 2018

(54) MEMORY SECTOR RETIREMENT IN A NON-VOLATILE MEMORY

(71) Applicant: NXP USA, INC., Austin, TX (US)

(72) Inventors: Fuchen Mu, Austin, TX (US); Botang Shao, Austin, TX (US)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/647,353

(22) Filed: Jul. 12, 2017

(51) Int. Cl.
*G11C 11/34* (2006.01)
*G06F 12/02* (2006.01)
*G11C 29/00* (2006.01)
*G11C 16/16* (2006.01)
*G11C 16/10* (2006.01)
*G11C 16/34* (2006.01)
*G06F 11/10* (2006.01)

(52) U.S. Cl.
CPC ...... *G06F 12/0246* (2013.01); *G06F 11/1072* (2013.01); *G11C 16/105* (2013.01); *G11C 16/107* (2013.01); *G11C 16/16* (2013.01); *G11C 16/3459* (2013.01); *G11C 29/82* (2013.01)

(58) Field of Classification Search
CPC ..... G11C 16/16; G11C 16/14; G11C 16/3445; G11C 16/344

USPC .......................... 365/185.29, 185.11, 185.22
See application file for complete search history.

(56) References Cited

U.S. PATENT DOCUMENTS 8,886,991 B2    11/2014   Zhang et al.
2016/0077906 A1*   3/2016   Scouller ............... G06F 11/073
                                                              714/33

* cited by examiner

*Primary Examiner* — Son Dinh
(74) *Attorney, Agent, or Firm* — Daniel D. Hill

(57) ABSTRACT

A non-volatile memory is arranged to have a plurality of sectors. Each sector of the plurality of sectors includes a plurality of record locations. A memory controller includes an erase counter, a failed sector flag, and a retired sector flag for each of the plurality of sectors. If a record location of a sector fails to program, another location in the sector is selected to be programmed. The failed sector flag is set if a predetermined number of selected record locations of the sector fails to program. If the failed sector flag is set for a particular sector twice, and an erase count is greater than a predetermined erase count, then the retired sector flag is set for the failed sector indicating the sector is to be permanently retired from use. A new sector of the plurality of sectors becomes the current active sector for record programming operations. The method for retiring a sector occurs dynamically, during operation of the non-volatile memory.

20 Claims, 3 Drawing Sheets

MEMORY SECTOR RETIREMENT IN A NON-VOLATILE MEMORY

BACKGROUND

Field

This disclosure relates generally to non-volatile memory and more specifically to sector retirement in a non-volatile memory.

Related Art

An EEPROM (electrically erasable programmable read only memory) emulation (EEE) system is a type of non-volatile memory that provides byte and/or word program and erase capability using a non-EEPROM type memory. For example, a volatile random access memory (RAM) may be used together with a flash memory to provide the EEE system. A typical flash memory cell uses a threshold voltage of the memory cell for determining a stored logic state. A flash memory cell has a limited number of program and erase operations before the flash memory becomes unreliable. Most failure-to-program (FTP) occurrences are due to mechanisms commonly referred to as trap-up and program disturb.

Some areas of a memory array may be weaker than others, and thus will wear out faster. Sometimes, a failed memory may be recovered so that it is functional again. A failed memory portion that cannot be recovered is retired, or no longer used, and removed from service. Service life of the system can be extended if the areas of non-volatile memory that wear out are retired. However, when the number of program and erase cycles is high, memory performance begins to suffer because of the larger number of FTPs. Therefore, a need exists for a way to improve the performance of a non-volatile memory at or near the end of its service life.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
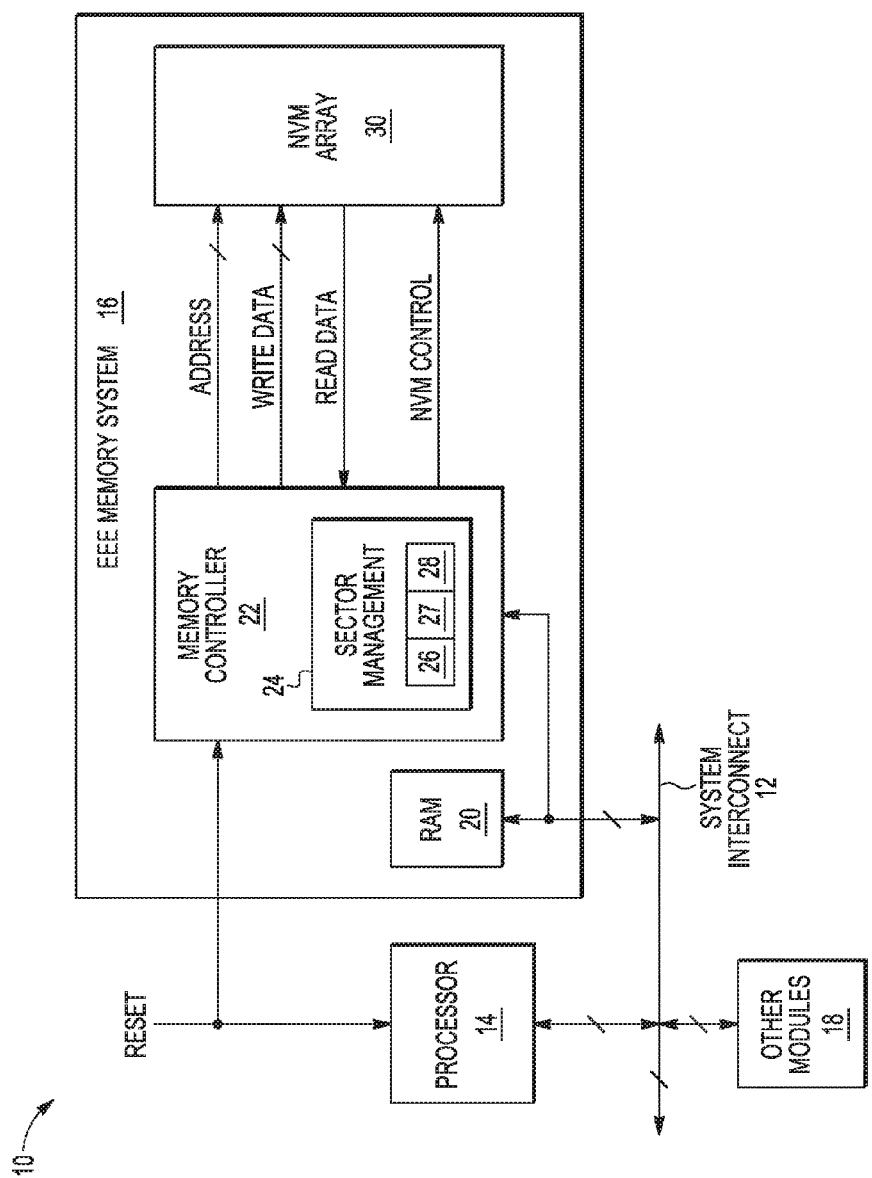
FIG. 1 illustrates a block diagram of a data processing system in accordance with an embodiment.

Generally, there is provided, a non-volatile memory having a plurality of sectors and a control circuit. Each sector of the plurality of sectors includes a plurality of record locations. The control circuit includes an erase counter, a failed sector flag, and a retired sector flag. A record location of an active sector may fail to program (FTP) because of, for example, trap-up or program disturb. If a record location fails to program, another location in the sector is selected to be programmed. The failed sector flag is set if a predetermined number of selected record locations fails to program. The predetermined number of selected record locations may be selected consecutively. If this is the second time the failed sector flag is set for a particular sector, and the erase counter has a predetermined erase count, then the retired sector flag is set indicating the sector is to be permanently retired from use. A new sector of the plurality of sectors becomes the current active sector for record programming operations. The method for retiring a sector occurs dynamically, during operation of the data processing system. Providing a failed sector flag to indicate potentially failing sectors provides high memory performance throughout the lifetime of the memory, and reduces test time of the memory by providing reasonably tight criteria to identify a sector for retirement.

In one embodiment, there is provided a method including: configuring a non-volatile memory array to have a plurality of sectors, each of the plurality of sectors having a plurality of record locations; selecting a record location of a sector of the non-volatile memory for a program operation; determining that a predetermined number of selected record locations for program operations of the sector have failed to program, wherein the predetermined number of selected record locations is fewer than a total number of record locations in the sector; setting a failed sector flag for the sector; determining that the predetermined number of selected record locations of the failed sector twice failed to program in the sector; determining that a predetermined number of erase operations of the sector has been exceeded; and retiring the sector. The method may further include: copying valid data from the sector to a second sector in response to the failed sector flag being set for the sector; and marking the sector for erasure. The method may further include: selecting a second sector for programming operations; determining that the predetermined number of selected record locations for program operations of the second sector have failed to program in the second sector; determining that the failed sector flag for the second sector was previously set; determining that a predetermined number of erase operations of the second sector has been exceeded; retiring the second sector; setting a retired sector flag for the retired second sector; and selecting a third sector for programming operations. The method may further include copying valid data from the retired second sector to the third sector. The non-volatile memory may be in an electrically erasable programmable read only memory (EEPROM) emulation system. The predetermined number of selected record locations may be selected consecutively. The predetermined number of erase operations may be equal to about 10,000 and the predetermined number of selected record locations is equal to three. Only one of the plurality of sectors may be active for programming operations at any one time.

In another embodiment, there is provided, a method for operating a non-volatile memory having a plurality of sectors, each sector having a plurality of record locations, the method including: selecting a first sector of the plurality of sectors for a plurality of programming operations; selecting a record location of the first sector for a programming operation; determining that the record location of the first sector failed to program; subsequent to the record location failing to the program, determining that a predetermined number of selected record locations of the first sector for program operations have failed to program, wherein the predetermined number of selected record locations is fewer than a total number of record locations in the first sector; setting a failed sector flag for the first sector; determining that the failed sector flag for the first sector had previously been set; determining that a predetermined number of erase operations of the first sector has been exceeded; retiring the first sector; setting a retired sector flag for the retired first sector; and selecting a second sector for programming operations. The non-volatile memory may be part of an electrically erasable programmable read only memory (EEPROM) emulation system. The predetermined number of selected record locations may be selected consecutively. The predetermined number of erase operations may be equal to about 10,000 and the predetermined number of selected record locations may be equal to three. The method may further include: copying valid data from the first sector to the second sector in response to the failed sector flag being set for the first sector; and marking the first sector for erasure. Only one of the plurality of sectors may be active for program operations at any one time.

In yet another embodiment, there is provided, a data processing system including: a non-volatile memory array arranged to have a plurality of sectors, each sector arranged to have a plurality of record locations; and a memory controller coupled to the non-volatile memory array, the memory controller arranged to control program, read, and erase operations of memory cells of the non-volatile memory array, the memory controller including: failed sector flag storage configured to store a failed sector flag for each of the plurality of sectors, the failed sector flag being set for a sector in response to a predetermined number of record locations of the sector failing to program; erase counter storage configured to store an erase count of a number of erase operations of each sector of the plurality of sectors; and retired sector flag storage configured to store a retired sector flag for each of the plurality of sectors, the retired sector flag being set for a sector in response to selected record locations of the sector twice failing to program the predetermined number of times and the erase count for the sector exceeding a predetermined erase count. The non-volatile memory may be part of an electrically erasable programmable read only memory (EEPROM) emulation system. The data processing system may further include: a system interconnect coupled to the non-volatile memory array; and a processor coupled to the system interconnect, the processor for processing records retrieved from the non-volatile memory array. The failed sector flag storage, the erase counter storage, and the retired sector flag storage may be storage locations in the non-volatile memory array. The memory controller may be arranged to determine which sector of the plurality of sectors is active for programming operations. The data processing system may further include a volatile memory coupled to the memory controller.

FIG. 1 illustrates a block diagram of data processing system 10 in accordance with an embodiment. Data processing system 10 includes system interconnect 12, processor 14, electrically erasable programmable read only memory (EEPROM) emulator (EEE) system 16, and other module(s) 18. Each of processor 14, EEE memory system 16 other module(s) 18 are bi-directionally coupled to system interconnect 12. System interconnect 12 may be any type of system for interconnecting the various portions of data processing system 10, such as a system bus, a crossbar switch, point-to-point connections, optical, and wireless transmission techniques. EEE memory system 16 includes random access memory (RAM) 20, memory controller 22, and non-volatile memory (NVM) array 30. NVM array 30 may be a flash array or any other type of NVM array formed using a semiconductor substrate. Memory controller 22 includes sector management logic 24. Sector management logic 24 includes storage for failed sector flag 26, erase count 27, and retired sector flag 28. In one embodiment, failed sector flag 26, erase count 27, and retired sector flag 28 are stored in registers located in sector management logic 24. In another embodiment, failed sector flag 26, erase count 27, and retired sector flag 28 are stored in NVM array 30 or another memory of data processing system 10. A reset signal is provided to processor 14 and memory controller 22. This reset signal may be, for example, a global reset signal for data processing system 10.

RAM 20 may be a volatile memory such as a static random access memory (SRAM) or a dynamic random access memory (DRAM). RAM 20 is bidirectionally coupled to system interconnect 12 and to memory controller 22. Memory controller 22 is coupled to system interconnect 12 and NVM array 30. Sector management logic 24 is coupled to NVM array 30. Memory controller 22 is configured to communicate with NVM array 30 with signals including address signals ADDRESS, program data signals WRITE DATA, read data signals READ DATA, and NVM control signals NVM CONTROL.

Processor 14 can be any type of processor or processor core, such as a microprocessor, microcontroller, digital signal processor (DSP), and the like, or may be any other type of interconnect master that can access EEE system 16. Other modules 18 may include any type of module or circuit, such as, for example, another memory, another processor, another interconnect master, a peripheral, an input/output (I/O) device, and the like. Alternatively, there may not be any other modules present in data processing system 10.

In operation, processor 14 can send access requests (read, write, or program access requests) to EEE memory system 16. The access requests from processor 14, which include an access address and, in the case of a write or program access, associated write data, are provided to RAM 20. In the case of a read access, RAM 20 provides to processor 14 the data stored at the received access address location. In the case of a write access, RAM 20 stores the received write data at the received access address location. Further in the case of a write access, memory controller 16 may detect such an update of RAM 20 and selectively store the received access address and associated write data to an active sector of NVM array 30 in a logically sequential manner. For example, in the case of an update (a write) to RAM 20, the received access address and associated write data are used to form a record that is programmed in NVM array 30 at the next available record or data location. This next available record location is logically sequential to a record location that was loaded during an immediately preceding loading of NVM array 30. In one example, the writing of the record corresponding to the RAM update is only performed (or stored in NVM array 30) if the value that is currently stored at the RAM location is different from the new write value associated with the write access request for that RAM 20 location. In this manner, NVM array 30 can store the updated values of RAM 20 in a more permanent manner. That is, when RAM 20 loses power, its data is lost. Upon restoring power, the values of RAM 20 may be restored (e.g., read) from NVM array 30, which does not lose its data upon losing power. In one embodiment, NVM array 30 has a greater storage capacity than RAM 20. For example, NVM array 30 may have a capacity at least four times greater than RAM 20 and typically much larger than that.

Figure 2:
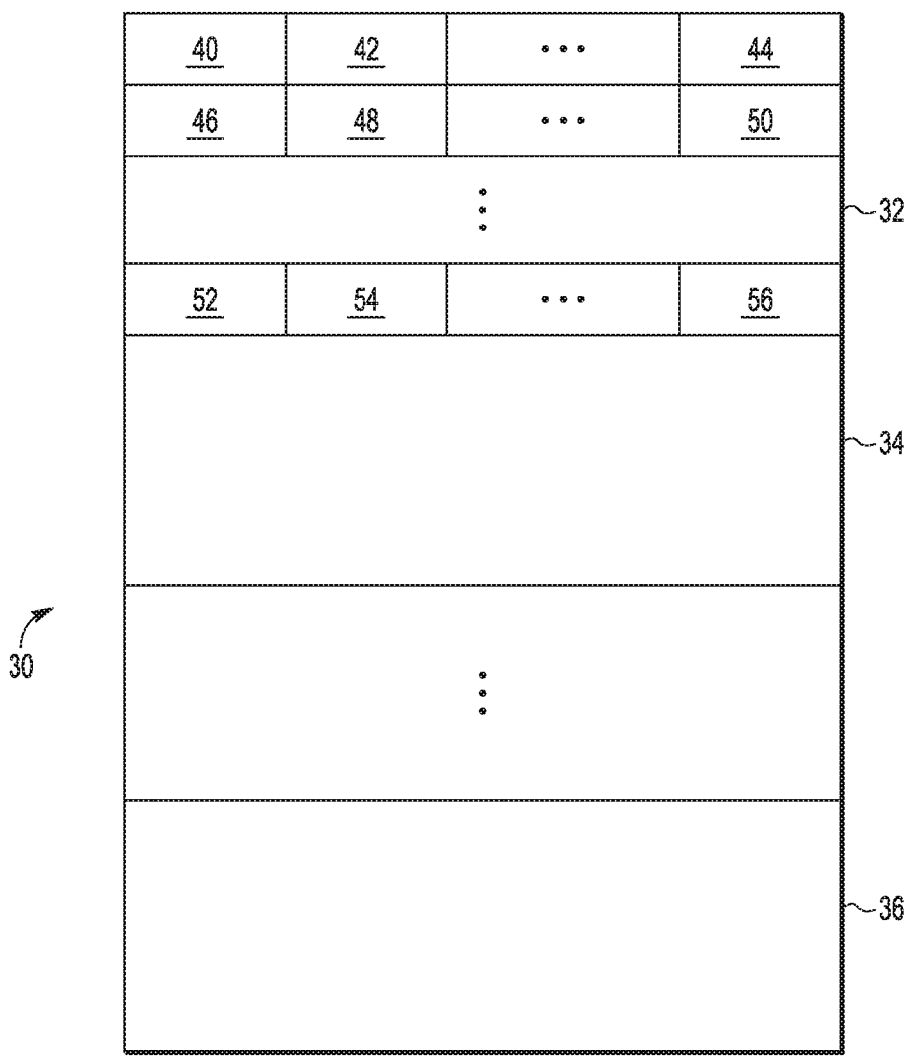
FIG. 2 illustrates the non-volatile memory array of FIG. 1 in more detail.

FIG. 2 illustrates an embodiment of NVM array 30 of FIG. 1 in more detail. Non-volatile memory array 30 is arranged as a plurality of sectors represented by sectors 32, 34, and 36. Each of sectors 32, 34, and 36 are arranged into a plurality of record locations represented in FIG. 2 by record locations 40, 42, 44, 46, 48, 50, 52, 54, and 56 in sector 32.

Non-volatile memory array 30 has a limited number of program/erase cycles before operation becomes unreliable. One way to increase the life of NVM array 30 is to include a large memory array arranged in sectors, where each sector corresponds in capacity to the capacity of RAM 20. Memory controller 22 controls which sector is active for programming operations. Only one sector may be active at a time. An erase counter and erase count storage 27 keeps a record of the number of erase operations for each sector. Generally, a record location is programmed with a record using a conventional programming process using a number of programming pulses interleaved with verify operations. In one embodiment, the record may be programmed with an encryption/decryption key. As the number of program and erase operations increases, the likelihood that a programming operation will fail increases. The failed sector flag in storage 26 is set in response to a predetermined number of record locations of an active sector failing to program. In one embodiment, the predetermined number of failed program locations are consecutively selected. There is a failed sector flag in storage 26 corresponding to each sector of NVM 30. In one embodiment, the retired sector flag in storage 28 is set for a sector in response to selected consecutive record locations of the sector twice failing to program the predetermined number of times and the erase count for the sector exceeding a predetermined erase count. There is a retired sector flag in storage 28 for each sector in NVM 30. Note that the determination of a sector failing twice can happen to different consecutive record locations. It is not necessary that the failures happen on the same set of consecutive record locations. Consecutive record locations are record locations that are accessed consecutively in time and in the same sector.

The predetermined number of failed record locations (PN1) that trigger a failed sector flag in storage 26 may be determined by the specification or requirement of one EEE write and post-silicon characterization. For example, if post-silicon characterization determines that four FTPs cause a EEE write to be out of specification or take too much time, then PN1 may be chosen to be three. Also, the predetermined number of erase operations (PN2) that can be expected from an NVM sector throughout the life of the memory may be determined by doing post-silicon characterization. For example, if it is determined that 10,000 erase cycles can be expected before a failed sector flag is set, then PN2 may be set to be 10,000.

One implementation for making a dynamic determination of whether to retire a sector may include a using two decision signals as a result of comparison of PN1 and PN2 via firmware or software logic, where $$\text{decision1} = \begin{cases} 0, & \text{number of } FTP's \le PN1 \\ 1, & \text{number of } FTP's > PN1 \end{cases}$$

and $$\text{decision2} = \begin{cases} 0, & \text{erase count} \le PN2 \\ 1, & \text{erase count} > PN2 \end{cases}$$

The failed sector flag and retired sector flag for each sector can be stored in dedicated NVM space or some other available non-volatile memory location.

Figure 3:
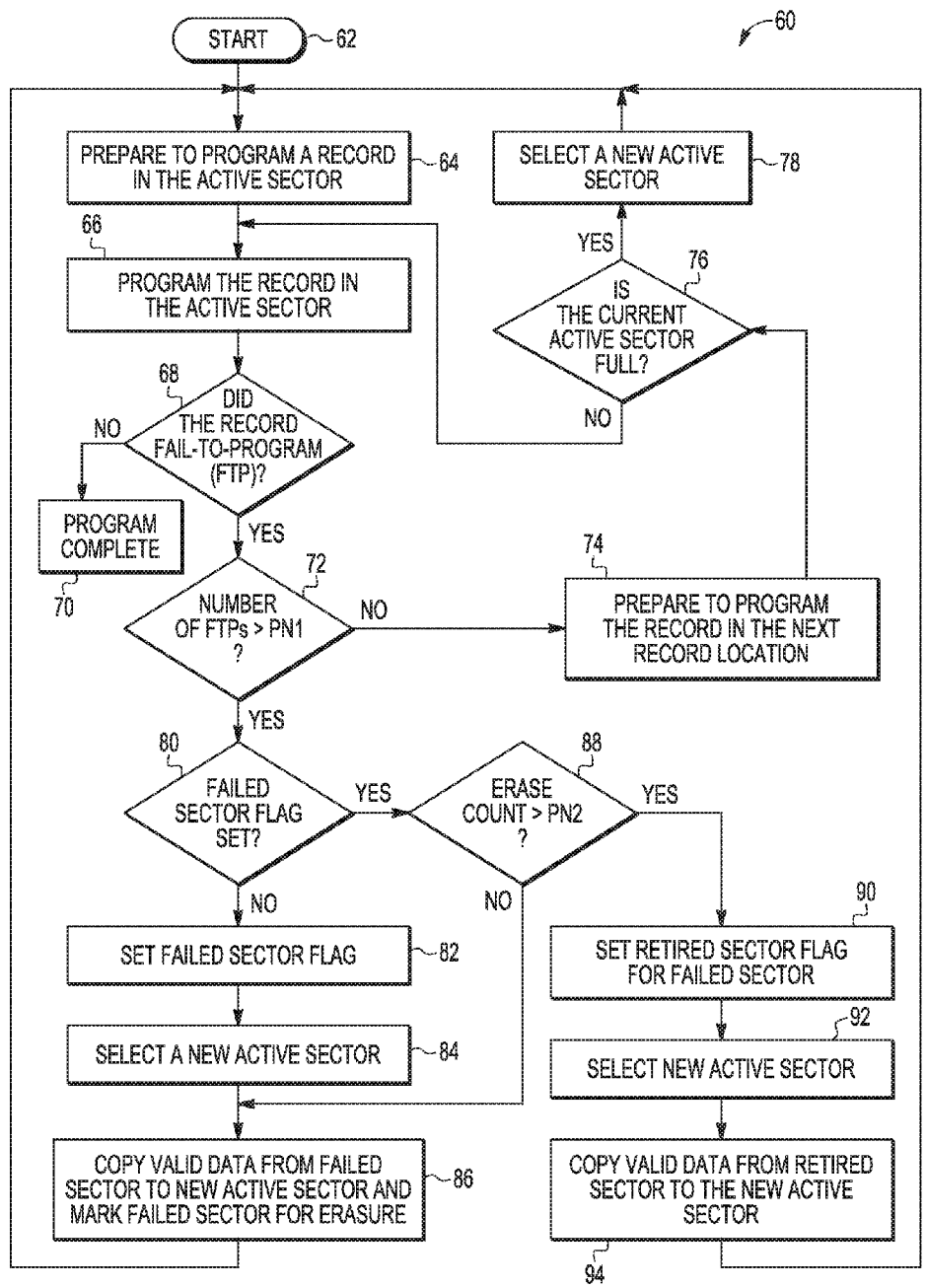
FIG. 3 illustrates a flowchart of a method for identifying a sector for retirement in accordance with an embodiment.

FIG. 3 illustrates a flowchart of method 60 in accordance with an embodiment. Method 60 is a method for identifying a failed sector and for retiring a sector in response to detecting failed record locations. Method 60 begins at step 62. At step 64, a record is prepared for programming in the currently active sector of NVM array 30. Program initialization includes a command entry check and address/data check of the data being prepared for programming. At step 66, the record is attempted to be programmed in the currently active sector. At decision step 68, it is determined if the record failed to program. The programming was successful if the programmed bits passed a program verify step and the bits that should stay erased passed an erase margin read step. If the record was successfully programmed in the active sector, the NO path is taken to step 70. At step 70, the programming was completed. If at decision step 68, the record failed to program, then the YES path is taken to decision step 72. At decision step 72, it is determined if the number of consecutive failed-to-program (FTP) record locations is greater than a predetermined number PN1. The predetermined number PN1 is less than the number of record locations in a sector, and generally much less. In one embodiment PN1 is equal to three. In another embodiment, PN1 may be different. If the number of FTPs is less than or equal to PN1, then the NO path is taken to step 74. At step 74, the record that previously failed to program is prepared to be programmed in the next record location. At decision step 76, it is determined if the current active sector is full. If the current active sector is full, then the YES path is taken to step 78 where a new active sector is selected and method 60 continues at step 64. If the current active sector is not full, the NO path is taken back to step 66 where method 60 continues as before. However, if at decision step 72 it is determined that the number of FTPs is greater than PN1, then the YES path is taken to decision step 80. At decision step 80, it is determined if the failed sector flag stored in storage location 26 had previously been set. If the failed sector flag had not been set for the active sector, then the NO path is taken to step 82 where the failed sector flag is set for the current active sector. At step 84, a new active sector is selected. At step 86, valid data, if any, is copied from the sector marked failed at step 82 to the new active sector and the failed sector is marked for erasure. After the failed sector is erased, the failed sector becomes a ready sector with the failed sector flag set. Method 60 continues back to step 64 where the steps are repeated in response to a new record needing to be programmed to the active sector. If at decision step 80 the failed sector flag had previously been set, indicating that this is the second time the same sector has failed to program, then the YES path is taken to decision step 88. At decision step 88, it is determined if the erase count, stored in erase count storage 27, is greater than a predetermined number of erasures PN2. The predetermined number of erasures PN2 is a number of erasures NVM 30 is expected to complete before failing. The number PN2 may be determined by experimentation or some other means. In one embodiment, number PN2 is equal to about 10,000. If the erase count is less than or equal to PN2, then the NO path is taken back to step 86. If the erase count is greater than PN2, then the sector is nearing, or has reached, its expected life expectancy and will be retired. The YES path is taken from decision step 88 to step 90. At step 90, the retired sector flag in storage location 28 is set for the failed sector to be retired. At step 92, a new active sector is selected. At step 94, valid data, if any, is copied from the retired sector to the new active sector. Method 60 then returns to step 64. Note that in method 60, a sector is allowed to fail once more after the failed sector flag is set before it is retired. In another embodiment, the sector may fail more than twice before being retired.

Method 60 for retiring a sector is dynamically executed during operation of data processing system 10. Providing a fail flag based on a predetermined number of consecutive FTPs to indicate potentially failing sectors in connection with the number of erasures provides high memory performance throughout the lifetime of the memory, and reduces test time of the memory by providing reasonably tight criteria to identify a sector for retirement.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the invention is described herein with reference to specific embodiments, various modifications and changes can be made without departing from the scope of the present invention as set forth in the claims below. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims. Generally, in a metal-oxide semiconductor (MOS) transistor of the above described embodiment, a source or drain may be referred to as a current electrode and a gate may be referred to as a control electrode. Other transistor types may be used in other embodiments.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A method comprising:
    configuring a non-volatile memory array to have a plurality of sectors, each of the plurality of sectors having a plurality of record locations;
    selecting a record location of a sector of the non-volatile memory for a program operation;
    determining that a predetermined number of selected record locations for program operations of the sector have failed to program, wherein the predetermined number of selected record locations is fewer than a total number of record locations in the sector;
    setting a failed sector flag for the sector;
    determining that the predetermined number of the selected record locations of the failed sector twice failed to program in the sector;
    determining that a predetermined number of erase operations of the sector has been exceeded; and
    retiring the sector.

2. The method of claim 1, further comprising:
    copying valid data from the sector to a second sector in response to the failed sector flag being set for the sector; and
    marking the sector for erasure.

3. The method of claim 1, further comprising:
    selecting a second sector for programming operations;
    determining that the predetermined number of selected record locations for program operations of the second sector have failed to program in the second sector;
    determining that the failed sector flag for the second sector was previously set;
    determining that a predetermined number of erase operations of the second sector has been exceeded;
    retiring the second sector;
    setting a retired sector flag for the retired second sector; and
    selecting a third sector for programming operations.

4. The method of claim 3, further comprising copying valid data from the retired second sector to the third sector.

5. The method of claim 1, wherein the non-volatile memory is in an electrically erasable programmable read only memory (EEPROM) emulation system.

6. The method of claim 1, wherein the predetermined number of selected record locations are selected consecutively.

7. The method of claim 1, wherein the predetermined number of erase operations is equal to about 10,000 and the predetermined number of selected record locations is equal to three.

8. The method of claim 1, wherein only one of the plurality of sectors is active for programming operations at any one time.

9. A method for operating a non-volatile memory having a plurality of sectors, each sector having a plurality of record locations, the method comprising:
    selecting a first sector of the plurality of sectors for a plurality of programming operations;
    selecting a record location of the first sector for a programming operation;
    determining that the record location of the first sector failed to program;
    subsequent to the record location failing to the program, determining that a predetermined number of selected record locations of the first sector for program operations have failed to program, wherein the predetermined number of selected record locations is fewer than a total number of record locations in the first sector;
    setting a failed sector flag for the first sector;
    determining that the failed sector flag for the first sector had previously been set;
    determining that a predetermined number of erase operations of the first sector has been exceeded;
    retiring the first sector;
    setting a retired sector flag for the retired first sector; and
    selecting a second sector for programming operations.

10. The method of claim 9, wherein the non-volatile memory is part of an electrically erasable programmable read only memory (EEPROM) emulation system.

11. The method of claim 9, wherein the predetermined number of selected record locations are selected consecutively.

12. The method of claim 9, wherein the predetermined number of erase operations is equal to about 10,000 and the predetermined number of selected record locations is equal to three.

13. The method of claim 9, further comprising:
copying valid data from the first sector to the second sector in response to the failed sector flag being set for the first sector; and
marking the first sector for erasure.

14. The method of claim 9, wherein only one of the plurality of sectors is active for program operations at any one time.

15. A data processing system comprising:
a non-volatile memory array arranged to have a plurality of sectors, each sector arranged to have a plurality of record locations; and
a memory controller coupled to the non-volatile memory array, the memory controller arranged to control program, read, and erase operations of memory cells of the non-volatile memory array, the memory controller comprising:
failed sector flag storage configured to store a failed sector flag for each of the plurality of sectors, the failed sector flag being set for a sector in response to a predetermined number of record locations of the sector failing to program;
erase counter storage configured to store an erase count of a number of erase operations of each sector of the plurality of sectors; and
retired sector flag storage configured to store a retired sector flag for each of the plurality of sectors, the retired sector flag being set for a sector in response to selected record locations of the sector twice failing to program the predetermined number of times and the erase count for the sector exceeding a predetermined erase count.

16. The data processing system of claim 15, wherein the non-volatile memory is part of an electrically erasable programmable read only memory (EEPROM) emulation system.

17. The data processing system of claim 15, further comprising:
a system interconnect coupled to the non-volatile memory array; and
a processor coupled to the system interconnect, the processor for processing records retrieved from the non-volatile memory array.

18. The data processing system of claim 15, wherein the failed sector flag storage, the erase counter storage, and the retired sector flag storage are storage locations in the non-volatile memory array.

19. The data processing system of claim 15, wherein the memory controller is arranged to determine which sector of the plurality of sectors is active for programming operations.

20. The data processing system of claim 15, further comprising a volatile memory coupled to the memory controller.

\* \* \* \* \*